ns of finely
United States Patent [19]

Mitchell

[11] 4,172,919

[45] Oct. 30, 1979

[54] COPPER CONDUCTOR COMPOSITIONS CONTAINING COPPER OXIDE AND Bi₂O₃-BASED GLASS

[75] Inventor: James D. Mitchell, Chadds Ford, Pa.

[73] Assignee: E. I. Du Pont de Nemours and Company, Wilmington, Del.

[21] Appl. No.: 916,158

[22] Filed: Jun. 16, 1978

Related U.S. Application Data

[63] Continuation-in-part of Ser. No. 789,959, Apr. 22, 1977, abandoned.

[51] Int. Cl.² .............................................. H01B 1/02
[52] U.S. Cl. ................................... 428/209; 252/512; 106/1.13; 428/433
[58] Field of Search .................. 252/512; 106/1, 1.13, 106/1.18, 1.23, 1.26; 428/209, 432, 433

[56] References Cited

U.S. PATENT DOCUMENTS

| | | | |
|---|---|---|---|
| 2,993,815 | 7/1961 | Treptow | 252/512 X |
| 3,293,501 | 12/1966 | Martin | 106/1.13 X |
| 3,450,545 | 6/1969 | Ballard et al. | 106/1.13 X |
| 3,794,518 | 2/1974 | Howell | 252/512 X |
| 4,072,771 | 2/1978 | Grier, Sr. | 427/96 |

FOREIGN PATENT DOCUMENTS

2424579  5/1976  Fed. Rep. of Germany.

*Primary Examiner*—Benjamin R. Padgett

[57] ABSTRACT

Compositions useful for making electrical conductor patterns on a nonconductive (dielectric) substrate, the compositions comprising certain proportions of finely divided copper, copper oxide and glass powders, dispersed in a vehicle. The compositions may be printed on a substrate and fired in a neutral atmosphere to produce conductor patterns adherent to the substrate.

13 Claims, No Drawings

COPPER CONDUCTOR COMPOSITIONS CONTAINING COPPER OXIDE AND BI₂O₃-BASED GLASS

CROSS-REFERENCE TO RELATED APPLICATION

This application is a continuation-in-part of copending application Ser. No. 789,959, filed April 22, 1977 now abandoned.

BACKGROUND OF THE INVENTION

This invention relates to electronics, and more particularly to compositions useful for producing conductor patterns adherent to substrates.

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the film, the metallic component of the composition provides the functional (conductive) utility, while the inorganic binder (e.g., glass, crystalline oxides such as $Bi_2O_3$, etc.) bonds the metal particles to one another and to the substrate. Thick film techniques are contrasted with thin film techniques which involve deposition of particles by evaporation or sputtering. Thick film techniques are discussed in "Handbook of Materials and Processes for Electronics", C. A. Harper, Editor, McGraw-Hill, N.Y., 1970, Chapter 12.

The most commonly used conductor compositions employ noble metals, especially gold, silver, platinum, palladium, and their mixtures and alloys, despite their relative costliness, since their relatively inert characteristics permit firing in air.

The prior art on conductor compositions includes the use of glass binders for noble metals, as well as the use of glass-free binders. Martin, U.S. Pat. No. 3,293,501, discloses conductive films of glasses comprising copper and bismuth oxides. Buck, et al., U.S. Pat. No. 3,776,769, discloses compositions of noble metal, copper oxide and glass, fireable in nonreducing atmospheres. Short, U.S. Pat. No. 2,819,170, discloses compositions of silver and a vitrifiable flux of bismuth oxide and cadmium borate.

German patent publication OS No. 2,424,579 (published Oct. 16, 1975; assigned to Jenaer Glaswerk Schott) discloses sintered composites of glass and copper and/or copper alloy made by molding or extrusion of powder starting materials or as conductive coatings. Specifically, claimed are compositions of copper or copper alloy, 0.8–8% copper oxide and 0.8–10% oxides of group IV–VI elements. It is preferred that the copper oxide be part of the glass powder, but also disclosed are physical mixtures of metal, glass, copper oxide and group IV–VI oxide (col. 4, lines 57–59). The only proportions disclosed are in the examples and are 1 part glass powder to 3 parts copper powder (col. 7, line 14). The powders are heated in a reducing atmosphere. No suggestion is made to fire these materials in a neutral atmosphere.

U.S. Pat. No. 4,072,771, issued on Feb. 7, 1978 to J. D. Grier, discloses copper thick film conductor pastes which comprise a solids mixture containing 92–97% by weight of copper, 1–5% by weight of copper oxide, and 1–10% by weight of glass frit. The solids mixture is made into a paste by mixing it with a fluid vehicle. The thick film is fireable in nitrogen atmosphere. It is required that there be an intentional and controlled preoxidation of the copper to form controlled levels of surface oxidized copper powder to achieve a satisfactory conductor. Lead borosilicate glass, with a lead oxide content of about 65% lead oxide, is the preferred glass frit disclosed.

The industry needs a less expensive conductor composition, based on a base metal such as copper, which can be fired in a neutral atmosphere (such as nitrogen), rather than the more expensive (and dangerous) hydrogen atmospheres sometimes used. The compositions should be capable of producing fired (sintered) films of good adhesion to typical substrates such as alumina, and have adequate solderability, or both. Also, good wetting of the copper by the glass employed is a must.

SUMMARY OF THE INVENTION

I have invented conductor compositions useful for forming conductive patterns (films) on dielectric substrates. The compositions can be fired in a neutral atmosphere such as nitrogen. Initial adhesion is usually at least 4 pounds, often more than 5 pounds. After aging at 150° C. for 16–24 hours, adhesion is still at least 2 pounds, and often in excess of 4 pounds. Solderability is acceptable. The needs of the particular end use will determine whether solderability or adhesion is more important.

The compositions are finely divided inorganic particles, dispersed in an inert liquid vehicle. The inorganic particles consist essentially of (a) 86–97% copper, (b) 1–7% copper oxide ($Cu_2O$ and/or $CuO$) and (c) 1–7% glass. The total weight of (b) and (c) is in the range 3–14%, but where the total weight of (b) and (c) is 3%, it is of 2% (b) and 1% (c). The glass contains at least 75% by weight of $Bi_2O_3$, even more preferably at least 80% thereof. It is preferred that the total weight of (b) and (c) is 3–11%.

The compositions preferably contain 90–97% (a), 1–7% (b) and 1–7% (c), more preferably 93% (a), 3.5% (b), and 3.5% (c). Cuprous oxide is often the preferred copper oxide. Preferred ratios of inorganic powder to vehicle are 80–90% inorganic particles and 10–20% vehicle.

Also of this invention are dielectric substrates on which the compositions of this invention have been printed and fired to drive off the vehicle and sinter the inorganic powder into an electrically and physically continuous coating adherent to the substrate.

DETAILED DESCRIPTION OF THE INVENTION

The compositions of the present invention comprise finely divided inorganic particles dispersed in an inert liquid medium or vehicle. The term "finely divided" will be understood by those skilled in the "thick film" art to mean particles sufficiently fine to pass through a 400-mesh screen (U.S. standard sieve scale). It is preferred that substantially all the particles have a largest dimension in the range 0.001–15 microns, the largest dimension more preferably being no larger than 5 microns. The copper powder is preferably made up of particles substantially all of which are in the range 0.2–2 microns in diameter. Such a powder can be prepared by crushing a copper (+) compound to approximately 1 micron size followed by reduction by hydrogen.

The glass is important in the present invention. At least about 1% by weight glass (based on total inorganics) is present to produce an acceptable level of adhesion. No more than about 7% glass is present to permit good conductivity and good solder acceptance. The glass contains at least 75%, preferably at least 80%, of $Bi_2O_3$, plus sufficient other glass constituents (such as $SiO_2$ and/or $B_2O_3$ and metal oxides) to form a glass.

The importance of the type of glass to be utilized in this invention can be seen from the data below. It was found unexpectedly that copper conductor compositions containing a glass having at least 75% by weight of $Bi_2O_3$ had better aged adhesion and slightly better initial adhesion than compositons containing a glass having PbO as its major constituent. It was further found unexpectedly, that $Bi_2O_3$-based glasses had better wetting of the copper than the PbO-based glass:

| COPPER CONDUCTOR COMPOSITIONS CONTAINING[1]: | | |
|---|---|---|
| | $Bi_2O_3$-based glass[2] | PbO-based glass[3] |
| initial adhesion | 4.3 lb. (all lead wires pulled from solder) | 4.3 lb. (3 lead wires pulled from solder and 3 failed at copper/substrate interface.) |
| aged adhesion (48 hr. at 150° C.) | 4.5 lb. | 3.6 lb. |
| wetting of copper by glass[4] | good | poor |

[1]The conductor compositions contained the following ingredients:
  copper         27.00 g.
  cuprous oxide   0.87 g.
  glass           0.57 g.
  vehicle         4.90 g.
[containing a solution of ethyl cellulose, 0.22 g. (having a viscosity of 40–52 centipoises as measured as a 5% by weight solution in 80/20//toluene/ethanol, by weight) dissolved in 0.48 g of β-terpineol and 0.97 g. of dibutyl phthalate, and 3.23 g. of dibutyl carbitol]. The ingredients were mixed, milled, printed, fired, and then tested. The data shown above are the average of six values, two substrates each, printed with three pads each per substrate for each composition.
[2]Glass constituents (% by weight): $Bi_2O_3$ (82.0)/PbO(11.0)/$B_2O_3$(3.5)/$SiO_2$(3.5).
[3]Glass constituents (% by weight): PbO (61.6)/$B_2O_3$(10.0)/$SiO_2$(25.9)/$Al_2O_3$(2.5).
[4]Wetting of copper by glass was determined qualitatively. A thin layer of glass powder was spread on copper foil. This was fired in a nitrogen atmosphere in a furnace at a peak temperature of 900° C. Both $Bi_2O_3$-based glasses (a second $Bi_2O_3$-based glass had the following constituents: $Bi_2O_3$, 76.7%, PbO, 10.9%, CaO, 1.4%; $Al_2O_3$, 0.7%; $B_2O_3$, 0.7%; $SiO_2$, 9.6%) formed a flattened out film on the copper foil upon firing, showing low contact angles while the PbO-based glass did not form a film, balled up, showing a higher contact angle with copper than the $Bi_2O_3$-based glasses.

The compositions of this invention, as indicated above, comprise in additon to copper, a crystalline material, copper oxide ($Cu_2O$ and/or CuO). The weight of copper oxide is 1–7% of the total weight of inorganic materials, provided that where the total weight of glass and copper oxide is only 3%, there is at least about 2% copper oxide.

I have discovered that solderable, adherent copper patterns can be produced by firing in a neutral atmosphere (such as nitrogen) on a dielectric substrate, by adding copper oxide and a glass with a large $Bi_2O_3$ content to a paste highly loaded with copper. The proportions of copper oxide and glass, and their overall weight, will determine specific characteristics obtained, as will glass compositions, particle size, firing conditions, etc., as is well known to those skilled in the art. Balancing materials and proportions, e.g., $Bi_2O_3$ content in the glass versus copper oxide content, will produce optimum properties. In some uses enhanced solderability will be more important than enhanced adhesion (initial and/or aged), and vice versa in other uses.

The inorganic particles are mixed with an inert liquid vehicle by mechanical mixing (e.g., on a roll mill) to form a paste-like composition. The latter is printed as "thick film" on conventional dielectric substrates in the conventional manner. Any inert liquid may be used as the vehicle. Any of the various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of vehicle to solids in the dispersions may vary considerably and depends upon the manner in which the dispersion is to be applied and the kind of vehicle used. Normally to achieve good coverage in screen printing the dispersions will contain, complementally, 70–90% solids and 10–30% vehicle. The compositions of the present invention may, of course, be modified by the addition of other materials which do not affect its beneficial characteristics.

Although screen printing is discussed above, other methods of application to substrates such as brushing, spraying, stamping, etc. can be used.

After drying to remove the vehicle, firing of the compositions of the present invention is carried out at temperatures and for times sufficient to sinter the inorganic materials and to produce conductor patterns adherent to the dielectric substrate. The duration and peak temperature of firing are selected interdependently, lower duration permitting lower temperatures, so long as sintering occurs. Generally firing will be conducted in the range 875°–925° C., for 5–30 minutes at peak, preferably 900° C., for 8–10 minutes at peak.

The term copper powder as used herein may of course include those commercially available copper powders which have a surface coating of copper oxide. Where such oxidized copper powders are used, the amount of copper oxide particle additions may be proportionally reduced.

EXAMPLES

The following examples and comparative showings are presented to illustrate the invention. In the examples and elsewhere in the specification and claims all parts, percentages, and ratios are by weight, unless otherwise stated. All firings were in nitrogen.

All of the inorganic materials used in these experiments had an average particle size in the range 0.5–10 microns, with substantially no particles larger than 15 microns. Typical thick film vehicles were used in the examples, such as dissolved in a mixture of dibutyl phthalate and terpineol or methacrylate polymer dissolved in terpineol.

The glasses used below are listed in Table 1.

Table 1

| Glass Constituent | Weight % | | |
|---|---|---|---|
| | Glass A | Glass B | Glass C |
| PbO | 82.9 | 11 | 0.7 |
| CaO | — | — | 4.0 |

Table 1-continued

| Glass Constituent | Weight % | | |
|---|---|---|---|
| | Glass A | Glass B | Glass C |
| BaO | — | — | 0.9 |
| Al$_2$O$_3$ | — | — | 5.7 |
| B$_2$O$_3$ | 17.1 | 3.5 | 26.7 |
| SiO$_2$ | — | 3.5 | 21.7 |
| Bi$_2$O$_3$ | — | 82 | — |
| Na$_2$O | — | — | 8.7 |
| ZnO | — | — | 27.6 |
| ZrO$_2$ | — | — | 4.0 |

After the inorganic solids and vehicle were thoroughly mixed by conventional roll milling techniques, the resultant dispersion was printed on a prefired alumina substrate through a patterned 325-mesh screen having nine 80-mil (2-mm) openings aligned in a 3 by 3 matrix. The print was dried at about 110°–120° C. to form a dry print. The dried print was heated in a conventional belt furnace over a 55–60 minute heating cycle, with about 8–10 minutes at a peak temperature of 900° C. The fired print had a thickness of about 0.6 mil (0.015 mm). Two to four substrates were printed with each composition, giving 6 to 12 data points.

Adhesion was tested as follows. Wire leads were attached to the fired conductor pads by placing a 20-gauge pretinned copper wire across three of the fired metallization pads and then dipping them in a solder pot (60Sn/40Pb) at a temperature between 220° C. and 230° C. Bond strengths were then measured by pulling the soldered leads at 90° to the substrate with an Instron tester. Several pads were pulled for each sample to obtain a representative bond strength.

"Aged" adhesion was determined after the fired and soldered product had been thermally aged at 150° C. for the number of hours indicated in Table 2.

Solder acceptance of the fired patterns was tested by first applying flux (Alpha 611, a mildly activated acid flux) to the fired parts, dipping the fluxed part for 3–5 seconds in the solder bath at 225° C., and observing the degree of soldering. "Excellent" solder wetting means complete solder wetting with no voids; "good" solder wetting showed only a few voids or unwet areas; and "fair" solder wetting shows significant voids and unwet areas.

Each set of data reported in Table 2 (e.g., A and B; C, 1 and 2; D, 3, 4, and 5; etc.) was obtained in side-by-side experiments and indicates trends found on varying materials. Examples 1–17 and Showings A–H all used a glass of this invention, a high Bi$_2$O$_3$ glass (glass B of Table 1).

TABLE 2

| Example (No.) or Showing (Letter) | Composition (wt. %) | | | | | | Adhesion (lb.) | | | Solderability* |
|---|---|---|---|---|---|---|---|---|---|---|
| | Vehicle | Cu | Cu$_2$O | CuO | glass wt. | No. | Init | aged 150° C. lb. | hr. | |
| A | 15.3 | 83.7 | — | — | 1 | B | 2.6 | 0 | 65 | G–E |
| B | 15.1 | 82.9 | 1 | — | 1 | B | 5.7 | 1.0 | " | E |
| C | 15.3 | 83.7 | — | — | 1 | B | 3.0 | 0 | 16 | G |
| 1 | 14.9 | 82.1 | 2 | — | 1 | B | 4.4 | 2.7 | " | G |
| 2 | 14.6 | 80.4 | 4 | — | 1 | B | 5.6 | 4.3 | " | G |
| D | 15.8 | 81.2 | 1 | — | 2 | B | 4.5 | 1.0 | 16 | G |
| 3 | 15.6 | 79.6 | 3 | — | 2 | B | 5.4 | 4.1 | " | G |
| 4 | 15.6 | 80.4 | 1 | — | 3 | B | 4.8 | 2.2 | " | G |
| 5 | 15.3 | 78.7 | 3 | — | 3 | B | 6.3 | 3.7 | " | G |
| E | 13.3 | 83.7 | — | — | 3 | B | 3.8 | 0.8 | 17 | F |
| 6 | 12.3 | 83.7 | 1 | — | 3 | B | 4.3 | 3.4 | " | F–G |
| F | 13.2 | 80.6 | — | — | 6.2 | B | 4.4 | 2.7 | 24 | F |
| 7 | 14.5 | 81.3 | 2.6 | — | 1.6 | B | 5.9 | 2.8 | " | G |
| G | 13.2 | 80.6 | — | — | 6.2 | B | 2.9 | 1.4 | 24 | G–E |
| 8 | 13.0 | 79.8 | 1 | — | 6.2 | B | 4.0 | 2.6 | " | E |
| 9 | 12.8 | 79.0 | 2 | — | 6.2 | B | 4.6 | 2.3 | " | G–E |
| 10 | 13.0 | 79.8 | — | 1 | 6.2 | B | 4.0 | 2.4 | " | E |
| 11 | 12.8 | 79.0 | — | 2 | 6.2 | B | 4.4 | 3.1 | " | G–E |
| 12 | 13.0 | 78.0 | — | 3 | 6.0 | B | 6.1 | 5.5 | 20 | P–F |
| 13 | 14.0 | 80.0 | — | 3 | 3.0 | B | 6.1 | 5.1 | " | F–G |
| 14 | 14.0 | 79.0 | 4 | — | 3 | B | 6.3 | 6.3 | 48 | G |
| 15 | 13.0 | 78.0 | 6 | — | 3 | B | 6.3 | 5.3 | " | F–G |
| H | 16.0 | 81.0 | — | — | 3 | B | 2.9 | 1.2 | 23 | G |
| 16 | 16.0 | 80.0 | 1 | — | 3 | B | 4.5 | 3.8 | " | G |
| 17 | 16.0 | 79.0 | 2 | — | 3 | B | 5.1 | 3.7 | " | G |
| I | 14.0 | 80.0 | 3 | — | 3 | C | 6.8 | 3.9 | 48 | VP |
| J | 13.2 | 80.6 | — | — | 6.2 | A | 3.9 | 0.8 | 17 | F–G |
| K | 15.3 | 82.6 | — | — | 3.1 | A | 2.9 | 0 | 17 | F–G |
| 18 | 14.4 | 81.4 | 2.6 | — | 1.6 | A | 5.4 | 3.0 | 24 | G |

*E means excellent, G good, F fair, P poor and VP as very poor.

Where there was insufficient glass, insufficient copper oxide, and/or insufficient total glass and copper oxide, results were inferior. The percentages in Table 2 would of course be somewhat larger on a solids basis.

Neither A nor B contained sufficient total copper oxide and glass, although results with B were improved over A due to the presence in B of some copper oxide. Showing C was a rerun of A on another day, compared with improved aged adhesion obtained with more glass in Examples 1 and 2.

Showing D employs a low total amount of glass and copper oxide. In this circumstance there should be at least 2% copper oxide to achieve acceptable aged adhesion. Examples 3 and 5 produce excellent results with 5 and 6% total copper oxide and glass, while Example 4 produces lower, but acceptable aged adhesion since there is 4% total copper oxide and glass.

Showing E contains no copper oxide and produces inadequate aged adhesion, whereas the addition of copper oxide in Example 6 dramatically improved this property, and also improved solderability.

A large amount of glass, absent copper oxide, produced only fair solderability in Showing F. Example 7 showed good solderability.

Showing G and Examples 8–11 all used a large amount of glass. The absence of copper oxide caused inferior aged adhesion in Showing G, but with copper oxide ($Cu_2O$ or CuO) in Examples 8–11, this property improved.

Example 12 used a high total of copper oxide and glass, but produced excellent adhesion, although reduced solderability versus the previous examples. These characteristics will be acceptable for some uses where increased adhesion is important. Example 13 used less glass and produced improved solderability.

Examples 14–15 show excellent adhesion and better solderability with large amounts of copper oxide.

Showing H produces inferior adhesion with no copper oxide. This property is improved in Examples 16–17. A glass not of this invention (ZnO glass C of Table 1) produced very poor solderability in Showing I. High PbO glass A (Table 1) produced poor aged adhesion absent copper oxide in Showings J and K, but good results with copper oxide present (Example 18). Since Examples 7 and 18 were not carried out side-by-side, no valid comparisons can be made based on these data between $Bi_2O_3$-based glass-containing conductor compositions and those containing PbO-based glass. However, the comparative data shown and discussed above establish the unexpected superiority of those copper conductor compositions which contain $Bi_2O_3$-based glass having at least 75% by weight of $Bi_2O_3$.

Another example not reported in Table 2 (Example 19) employed a preferred composition of 80.5% copper, 3.0 parts glass, 3.0 parts $Cu_2O$, and 14.5 parts vehicle. The glass is glass B (a high $Bi_2O_3$ glass) of Table 1. Initial adhesion was 6.5 lb., aged adhesion (after 24 hours at 150° C.) was 5.4 lb. Solderability was good to excellent.

I claim:

1. A copper conductor composition fireable in a neutral atmosphere to produce a solderable, adherent conductor pattern on a dielectric substrate, said composition comprising finely divided inorganic particles dispersed in an inert liquid vehicle, said inorganic particles consisting essentially of, by weight,
   (a) 86–97% copper,
   (b) 1–7% copper oxide,
   (c) 1–7% glass comprising 75% or more of $Bi_2O_3$,
the total weight of (b) and (c) being in the range 3–14%, provided that where the total weight of (b) and (c) is 3%, it is of 2% (b) and 1% (c).

2. A composition according to claim 1 of 90–97% (a), 1–7% (b), and 1–7% (c).

3. A composition according to claim 1 wherein the total weight of (b) and (c) is in the range 3–11%.

4. A composition according to claim 2 wherein the total weight of (b) and (c) is in the range 3–11%.

5. A composition according to claim 1 wherein glass (c) comprises at least 80% of $Bi_2O_3$.

6. A composition according to claim 3 wherein glass (c) comprises at least 80% $Bi_2O_3$.

7. A composition according to claim 1 wherein (b) is $Cu_2O$.

8. A composition according to claim 1 wherein (b) is CuO.

9. A composition according to claim 1 of 80–90% said inorganic particles and 10–20% said inert liquid vehicle.

10. A composition according to claim 1 of about 93% (a), 3.5% (b), and 3.5% (c).

11. A dielectric substrate having adherent thereto a sintered composition of the inorganic particles of claim 1.

12. A dielectric substrate having adherent thereto a sintered composition of the inorganic particles of claim 2.

13. A dielectric substrate having adherent thereto a sintered composition of the inorganic particles of claim 10.

* * * * *